Dec. 30, 1958 B. T. MATTHIAS 2,866,842

SUPERCONDUCTING COMPOUNDS

Filed July 30, 1953

INVENTOR
B. T. MATTHIAS
BY Alan C. Rose
ATTORNEY

United States Patent Office 2,866,842

Patented Dec. 30, 1958

2,866,842

SUPERCONDUCTING COMPOUNDS

Bernd Teo Matthias, Berkeley Heights, N. J., assignor to Bell Telephone Laboratories, Incorporated, New York, N. Y., a corporation of New York Application July 30, 1953, Serial No. 371,396

5 Claims. (Cl. 174—15)

This invention relates to superconducting compounds and to electrical systems employing them.

The term superconduction is applied to the phenomenon of exceedingly low electrical resistance which many substances exhibit at very low temperatures. The electrical resistance of materials in their superconducting state is so low that a person in Washington, D. C. could readily talk to a person in San Francisco over telephones connected together only by superconducting wires, without the assistance of the many amplifiers which are now used to overcome the resistance in such circuits.

A substantial problem in the superconducting field, however, is the extremely low temperatures which are required for superconductivity in most materials. For example, the material having the highest known superconduction temperature up to the present time is vanadium silicide ($V_3Si$) which is superconducting at temperatures below 17.0 degrees Kelvin which corresponds to approximately −256.2 degrees centigrade. Inasmuch as the expense of refrigeration decreases with increasing temperatures, it would clearly be desirable to discover materials having higher superconduction temperatures.

Accordingly, one object of the present invention is to raise the temperature at which superconduction occurs.

In low temperature work it is quite useful to have temperature reference points in the form of samples which become superconducting at different temperatures. Because each superconducting element and binary compound normally has a specific superconducting temperature, the preparation and assemblage of samples to cover a temperature range is a substantial undertaking.

A further object of the present invention is to prepare a group of samples having discretely different superconduction temperatures within a given temperature range as simply as possible.

In accordance with the invention, it has been discovered that the superconduction temperature of a binary compound may be increased by increasing the lattice spacing thereof by the substitution of a suitable third element for one of the two elements of the binary compound. In addition, it has been found desirable that the resulting ternary compound have approximately five electrons per atom.

Other objects and certain features and advantages will become apparent in the course of the following detailed description of the invention as supplemented by the accompanying drawings.

Figure 1:
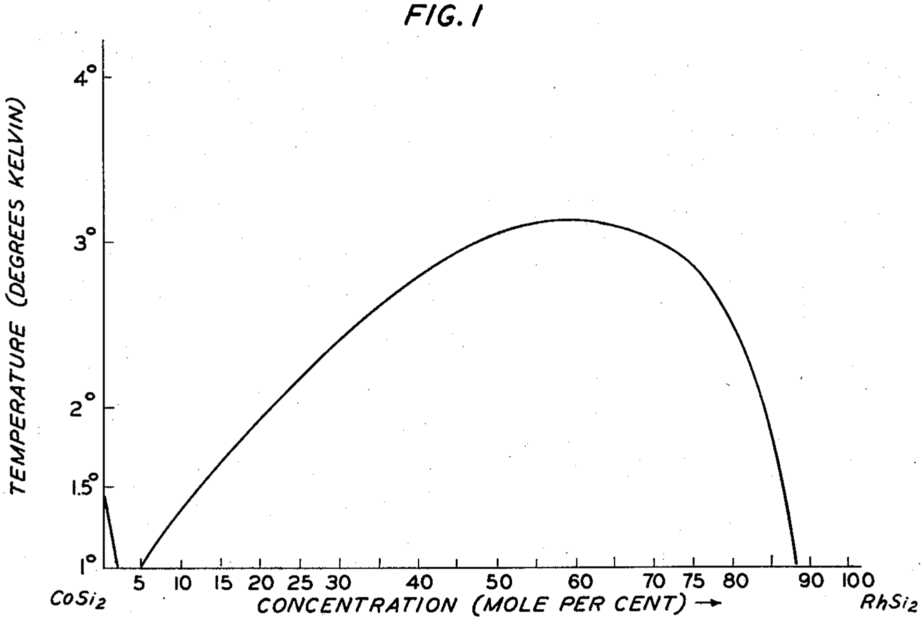
Fig. 1 is a plot of superconduction temperature vs. concentration for the ternary compound $(CoRh)Si_2$.
Figure 2:
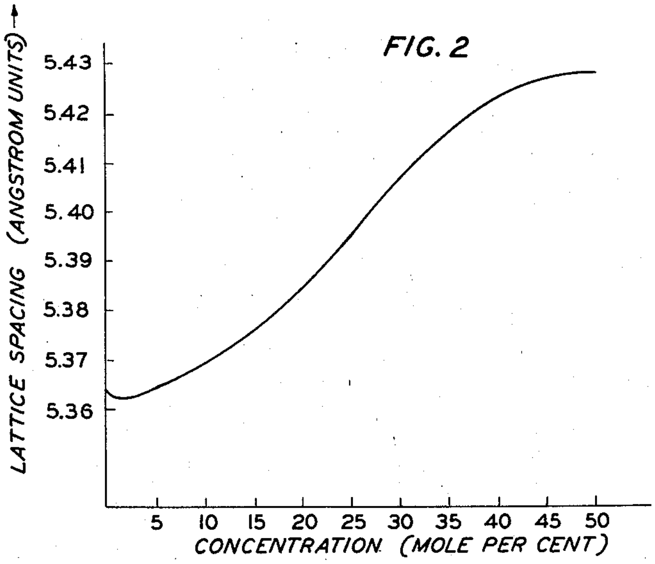
Fig. 2 shows the variation of lattice spacing with concentration for the same compound.

Referring more particularly to the drawings, Figs. 1 and 2 show by way of example and for purposes of illustration the critical dependency of the superconduction temperature on the lattice spacing for a superconducting ternary compound. Thus, in Fig. 1 the plot of superconducting temperature vs. concentration of $CoSi_2$ and $RhSi_2$ shows that the ternary compound made of 50 percent $CoSi_2$ and 50 percent $RhSi_2$ has a superconduction temperature above 3 degrees Kelvin, whereas $CoSi_2$ alone only becomes superconducting below 1.3 degrees Kelvin and $RhSi_2$ is not superconducting in the measurable range (above 1.11 degrees Kelvin).

The plot of Fig. 2 shows the variation in lattice spacing over the critical concentration range of Fig. 1. A comparison of these curves indicates the strong dependence of superconduction temperature on lattice spacing. In this regard, it may be observed that an increase in lattice spacing from 5.37 Angstrom units to 5.43 Angstrom units, which is an increase of only about one percent, results in an increase in the superconduction temperature of more than one hundred percent. It appears, therefore, that the transition temperature of superconducting systems will increase exponentially with increased volume.

In addition to the lattice spacing, another important factor involved in the superconduction phenomenon is the number of valence electrons per atom. As may be observed in Table I which follows, the existing superconductors with relatively high transition temperatures ($T_c$) indicate that the optimum number of valence electrons per atom (R) is slightly below five.

*Table I*

| Element or compound | $T_c$ (degrees Kelvin) | R |
|---|---|---|
| Nb | 8–8.3 | 5 |
| Pb-As (alloy) | 8.4 | 4.5–5 |
| Pb-Bi | 7.3–8.8 | 5 (app.) |
| MoC | 7.6–8.3 | 5 |
| ZnN | 9.3–9.6 | 4.5 |
| 2Nb-1Zr (alloy) | 10.8 | 4.67 |
| MoN | 12–12.5 | 5.5 |
| $V_3Si$ | 17.0 | 4.75 |

Applying the foregoing principles to the binary compound NbN, which has a superconduction transition temperature of about 15.6, a system of ternary compounds Nb (C, N) was prepared and tested. As may be observed in Fig. 3 on page 303 of an article by P. Duwez and F. Odell which appeared at pages 299 through 304 of the October 150 issue of the Journal of the Electrochemical Society, the substitution of carbon for nitrogen in the binary compound NbN substantially increases the lattice spacing (from about 4.37 to about 4.46 Angstrom units) over the entire range of concentrations. However, over this same range of concentrations the number of valence electrons decreases from 5.0 for NbN to 4.5 for NbC. As expected, an increase in the transition temperature from 15.7 degrees Kelvin for NbN up to above 18 degrees Kelvin for mixed crystals having 70 to 75 percent NbN was observed.

There is some scattered mention in the prior art of increasing the superconduction transition temperature of a particular element or compound by strain or a particular firing method. However, the teachings involved in the present invention have resulted in a ternary compound time. This has been achieved by the substitution of a third element for one of the elements in a known superconductor so that the resulting ternary compound has an increased lattice spacing but does not have an unduly large shift in number of valence electrons per atom away from the optimum of five, as compared with the original binary compound. In general, a range of about 4.5 to 5.5 is contemplated and a range of 4.75 to 5.25 is preferred.

A similar increase in transition temperature was observed for Nb(NSi) with a maximum of about 17 degrees Kelvin at a concentration of 70 percent NbN and about 30 percent of NbSi. This critical point was determined by the increased lattice spacing of NbSi over NBN up to the point where the effect of the lesser number of valence electrons per atom of NbSi (4.5 electrons per atom) as compared to the 5 electrons per atom of NbC, overbalanced the lattice effect.

The atomic weight of the elements is a third and less important factor which affects the superconduction temperature. Previous studies indicate that for a given series of superconducting isotopes the transition temperature is approximately inversely proportional to the square root of the atomic mass.

The following table shows certain factors which appear to be important in determining the superconducting temperature of three systems which we have discussed in detail hereinbefore.

*Table II*

| Element | Atomic Mass | Valence Electrons Per Atom | Atomic Radii (Angstroms) |
|---|---|---|---|
| Co | 58.94 | 2,3 | 1.26 |
| Rh | 102.91 | 2,3 | 1.34 |
| Si | 28.06 | 4 | 1.18 |
| Nb | 92.91 | 5 | 1.43 |
| Zr | 91.22 | 4 | 1.60 |
| N | 14.008 | 3,5 | .71 |
| C | 12.01 | 4 | .77 |

The following table shows the transition temperatures for the ternary compounds discussed above, and for the binary compounds from which the ternary systems are derived.

*Table III*

| Compound: | Transition temperature, ° K. |
|---|---|
| CoSi | 1.3 |
| $RhSi_2$ | Below 1.11 |
| $(Co_{.5}Rh_{.5})Si_2$ | 3.6 |
| NbN | 15.7 |
| NbSi | 6 |
| $Nb(N_{.7}Si_{.3})$ | 17 |
| NbN | 15.7 |
| NbC | 10.1 |
| $Nb(N_{.3}C_{.7})$ | 18.0 |

Closely related to the optimum number of five electrons per atom is the position of the superconducting elements and compounds in the periodic table. As set forth in an article in the Physical Review, vol. 87, No. 5, pages 799 through 806, September 1952, by B. T. Matthias and J. K. Hulm, the known superconducting elements lie in two distinct regions of the periodic table, one within groups 3A to 8A and the second within groups 2B to 4B. In view of the present study which shows the importance of approximately 5 electrons per atom, the emphasis will be shifted somewhat toward the fourth, fifth and sixth groups of the periodic table.

In the process of measuring the transition temperature of systems such as the NbN—NbC compounds, series of samples were prepared which have progressively different concentrations. These samples have correspondingly different transition temperatures, and, once these temperatures are ascertained, form a series of temperature check points which are useful, for example, in calibrating new low temperature equipment. Laboratory arrangements for measuring transition temperatures are well known to those skilled in the art; an arrangement similar to that used in the present work is shown in Fig. 1 of the article by Matthias and Hulm cited above.

Figure 3:
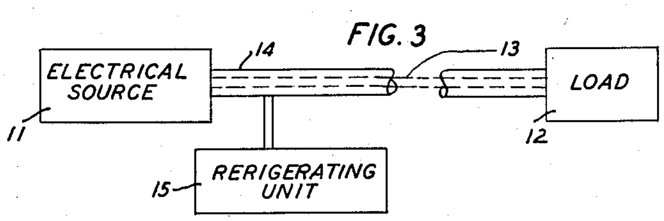
Fig. 3 is a schematic diagram of an electrical system employing a superconducting transmission line.

Fig. 3 illustrates an electrical system in which the electrical source 11 is coupled to the load 12 by means of the superconducting transmission line 13. Enclosing the transmission line 13 is a cooling jacket 14 which is cooled by means of the refrigerating unit 15. This refrigerating unit may, for example, be a reservoir of a liquid such as liquid helium which will maintain the superconducting material 13 below its transition temperature.

It is to be understood that the above-described arrangements are illustrative of the application of the principles of the invention. Numerous other arrangements, such as the use of four or more elements to form superconducting compounds, may be devised by those skilled in the art without departing from the spirit and scope of the invention.

What is claimed is:

1. In combination, a superconductor consisting of a solid solution of NbN and NbC, including at least 5 percent of either of said binary compounds, and means for artificially refrigerating said superconductor.

2. In combination, a superconducting electrical conductor including at least three elements comprising a crystalline superconducting ternary compound including a superconducting binary compound in which a third element is substituted for a portion of one of the two elements in the crystal lattice of said binary compound, said third element having a greater atomic diameter than the element for which it was substituted, said conductor having a greater lattice spacing than said binary compound and having approximately five valence electrons per atom, means for artificially refrigerating said conductor, and means for applying electrical signals to said conductor.

3. A combination as set forth in claim 2 wherein the superconducting electrical conductor has between 4.75 and 5.25 valence electrons per atom.

4. In an electrical transmission system, a source of electrical signals, a remote useful load, a superconducting electrical conductor interconnecting said source and said load, said conductor including at least three elements and comprising a crystalline superconducting ternary compound including a superconducting binary compound in which at least one additional element is substituted for a portion of one of the two elements in the crystal lattice of said binary compound, said additional element having a greater atomic diameter than the element for which it was substituted, said conductor having a greater lattice spacing than said binary compound and having approximately five valence electrons per atom, and means for artificially refrigerating said conductor.

5. In combination, a superconductor comprising a solid solution of NbN and NbC, including approximately 25 to 30 percent NbC and approximately 70 to 75 percent NbN, and means for artificially refrigerating said superconductor.

References Cited in the file of this patent

UNITED STATES PATENTS

| | | |
|---|---|---|
| 589,161 | Chaplet | Aug. 31, 1897 |
| 650,987 | Ostergren | June 5, 1900 |
| 685,012 | Tesla | Oct. 22, 1901 |
| 2,533,908 | Andrews | Dec. 12, 1950 |
| 2,704,431 | Steele | Mar. 22, 1955 |

OTHER REFERENCES

"Binary Systems of Nitrides and Carbides," Electrochemical Society Journal, vol. 97, 1950, pages 302–303. (Copy in Div. 56.)

"Superconducting Silicides and Germanides," Physical Review, Ser. 2, vol. 89, Jan.-Mar. 1953, page 884. (Copy in Scientific Library.)